(12) United States Patent
Oshige

(10) Patent No.: US 10,937,996 B2
(45) Date of Patent: Mar. 2, 2021

(54) DISPLAY APPARATUS AND METHOD OF MANUFACTURING THE SAME

(71) Applicant: CANON KABUSHIKI KAISHA, Tokyo (JP)

(72) Inventor: Hidemasa Oshige, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 152 days.

(21) Appl. No.: 16/369,309

(22) Filed: Mar. 29, 2019

(65) Prior Publication Data
US 2019/0312224 A1 Oct. 10, 2019

(30) Foreign Application Priority Data
Apr. 10, 2018 (JP) .............................. JP2018-075618

(51) Int. Cl.
| | |
|---|---|
| *H01L 51/52* | (2006.01) |
| *G09G 3/3225* | (2016.01) |
| *G09G 3/3266* | (2016.01) |
| *H01L 27/32* | (2006.01) |

(52) U.S. Cl.
CPC ......... *H01L 51/529* (2013.01); *G09G 3/3225* (2013.01); *G09G 3/3266* (2013.01); *H01L 27/3276* (2013.01); *H01L 51/5253* (2013.01); *G09G 2330/04* (2013.01); *G09G 2330/045* (2013.01); *H01L 2227/323* (2013.01)

(58) Field of Classification Search
CPC .............. H01L 51/529; G09G 2330/04; G09G 2330/045
USPC ............................................... 257/40; 349/49
See application file for complete search history.

(56) References Cited

U.S. PATENT DOCUMENTS

| | | | |
|---|---|---|---|
| 8,455,969 B2 | 6/2013 | Nabe et al. | |
| 2008/0283951 A1 | 11/2008 | Nabe et al. | |
| 2014/0306260 A1* | 10/2014 | Yamazaki | ............. H01L 51/003 257/99 |
| 2018/0123080 A1* | 5/2018 | Kim | .................... H01L 27/3262 |
| 2018/0182834 A1* | 6/2018 | Toyotaka | ............ H01L 27/3218 |

FOREIGN PATENT DOCUMENTS

| | | |
|---|---|---|
| JP | 2008-288309 A | 11/2008 |
| JP | 2009288309 A | 11/2008 |

* cited by examiner

*Primary Examiner* — David Vu
*Assistant Examiner* — Brandon C Fox
(74) *Attorney, Agent, or Firm* — Venable LLP

(57) ABSTRACT

A display apparatus, comprising an element substrate including a display portion formed by arraying a plurality of organic light emitting elements on a base and a connecting portion provided on the base so as to be separated from the display portion, a driving substrate connected to the connecting portion so as to be configured to drive the display portion, and a heat-insulating portion provided between the display portion and the connecting portion in planar view in the base and configured to have lower heat conductivity than the base.

17 Claims, 6 Drawing Sheets

DISPLAY APPARATUS AND METHOD OF MANUFACTURING THE SAME

BACKGROUND

Field of the Disclosure

The present invention relates to a display apparatus mainly using an organic light emitting element.

Description of the Related Art

Some of display apparatuses used for various types of electronic devices such as the electronic viewfinder of a camera, the display of a TV set, and the touch panel of a portable terminal use an organic light emitting element. Such a display apparatus is also called an organic EL display or the like.

An organic light emitting element is formed on, for example, a glass substrate or silicon substrate. An organic light emitting element is generally susceptible to heat, and hence is required to achieve an improvement in the structure of a display apparatus so as to prevent the deterioration of an organic light emitting element caused by heat at the time of manufacture. Note that Japanese Patent Laid-Open No. 2008-288309 discloses the structure of a solid-state image capturing apparatus, which is provided with an opening that does not penetrate a semiconductor substrate as a heat-insulating portion that reduces thermal gradients among a plurality of electronic circuits. However, there is no description about the above organic light emitting element susceptible to heat at the time of manufacture. That is, there is no disclosure about the structure of a display apparatus for suppressing heat conduction to an organic light emitting element.

The present invention provides a display apparatus that suppresses the conduction of heat at the time of manufacture to an organic light emitting element.

SUMMARY

One aspect of the present invention relates to a display apparatus. The display apparatus comprises an element substrate including a display portion formed by arraying a plurality of organic light emitting elements on a base and a connecting portion provided on the base so as to be separated from the display portion, a driving substrate connected to the connecting portion so as to be configured to drive the display portion, and a heat-insulating portion provided between the display portion and the connecting portion in planar view in the base and configured to have lower heat conductivity than the base.

Further features of the present invention will become apparent from the following description of exemplary embodiments with reference to the attached drawings.

BRIEF DESCRIPTION OF THE DRAWINGS

FIG. 1B1 is a circuit diagram for explaining an example of the arrangement of the display apparatus;

FIG. 1B2 is a circuit diagram for explaining an example of the arrangement of the display apparatus;

DESCRIPTION OF THE EMBODIMENTS

Figure 1A:
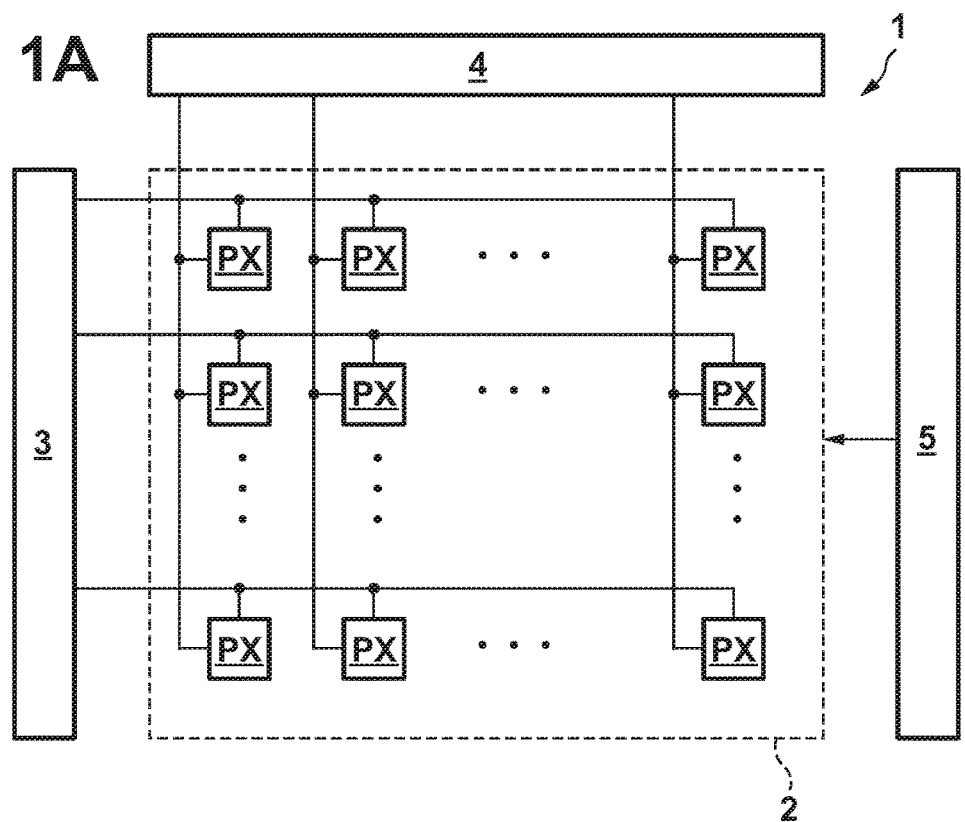
FIG. 1A is a circuit diagram for explaining an example of the arrangement of a display apparatus.

Preferred embodiments of the present invention will be described below with reference to the accompanying drawings. Each drawing is made only for the purpose of explaining structures and arrangements, and the dimensions of each member illustrated do not necessarily reflect the actual dimensions. The same reference numerals denote the same members or constituent elements, and a description of redundant contents will be omitted. In describing each drawing, terms like "on (above)" and "under (below)" indicate the relative positional relationship between the respective elements.

First Embodiment

FIG. 1A shows an example of the arrangement of a display apparatus 1 according to the first embodiment. The display apparatus 1 is an organic EL display (Organic Electro-Luminescence Display), and includes a pixel portion 2, a scanning signal driver 3, an information signal driver 4, and a voltage supply unit 5.

The pixel portion 2 has a plurality of pixels PX arrayed to form a plurality of rows and a plurality of columns. The scanning signal driver 3 supplies a scanning signal SIG3 to the plurality of pixels PX for each row by using a signal line provided for each row. The information signal driver 4 supplies an information signal SIG4 to the plurality of pixels PX for each column by using a signal line provided for each column. The voltage supply unit 5 supplies a power supply voltage (for example, a ground voltage) to the plurality of pixels PX.

Figure 1A:
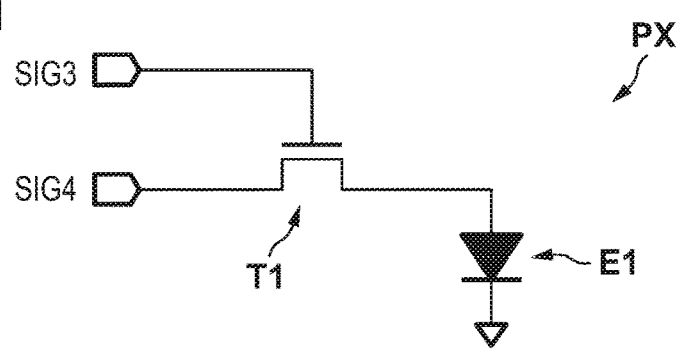
Figure 1A:
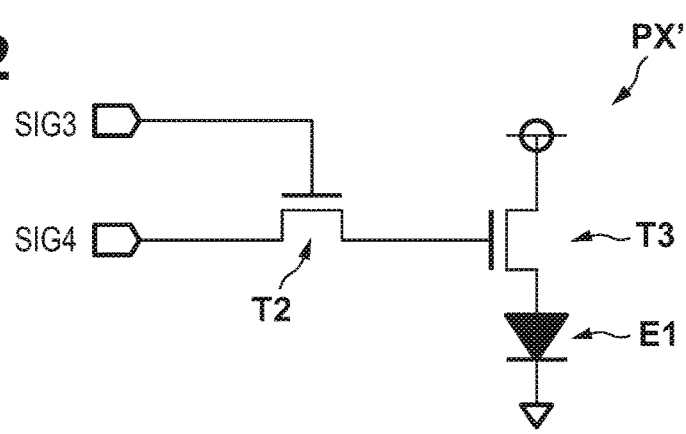

FIG. 1B1 shows an example of the arrangement of the pixel PX. The pixel PX includes an OLED (Organic Light-Emitting Diode) E1 and a transistor T1. Although described in detail later, the organic light emitting element E1 includes an organic compound layer configured to emit light upon receiving a predetermined voltage. Assume that this embodiment uses a MOS transistor as the transistor T1. The source terminal of the transistor T1 is connected to the anode of the organic light emitting element E1. The transistor T1 receives the scanning signal SIG3 via the gate terminal, and receives the information signal SIG4 via the drain terminal. The cathode of the organic light emitting element E1 is grounded by the voltage supply unit 5.

In such a pixel arrangement, upon being selected in response to the reception of the activation-level scanning signal SIG3 from the scanning signal driver 3, each pixel PX is driven to cause the organic light emitting element E1 to emit light in response to the reception of the activation-level information signal SIG4 from the information signal driver 4. Assume that the transistor T1 is an N-channel transistor. In this case, when both the scanning signal SIG3 and the information signal SIG4 are at high level, the transistor T1 is rendered conductive, and the organic light emitting element E1 is driven to emit light.

For the sake of descriptive convenience, the above pixel arrangement having the single transistor T1 is exemplified as the pixel PX. However, this is not exhaustive. For example, as indicated by a pixel PX' in FIG. 1B2, transistors T2 and T3 may be used instead of the transistor T1. In this case, the source terminal of the transistor T2 is connected to the gate terminal of the transistor T3. The transistor T2 receives the scanning signal SIG3 via the gate terminal, and receives the information signal SIG4 via the drain terminal. In addition, the transistor T3 is connected in series with the organic light emitting element E1 between the power supply potential and the ground potential. This pixel arrangement can also implement the same function as that of the pixel PX described above.

Figure 2A:
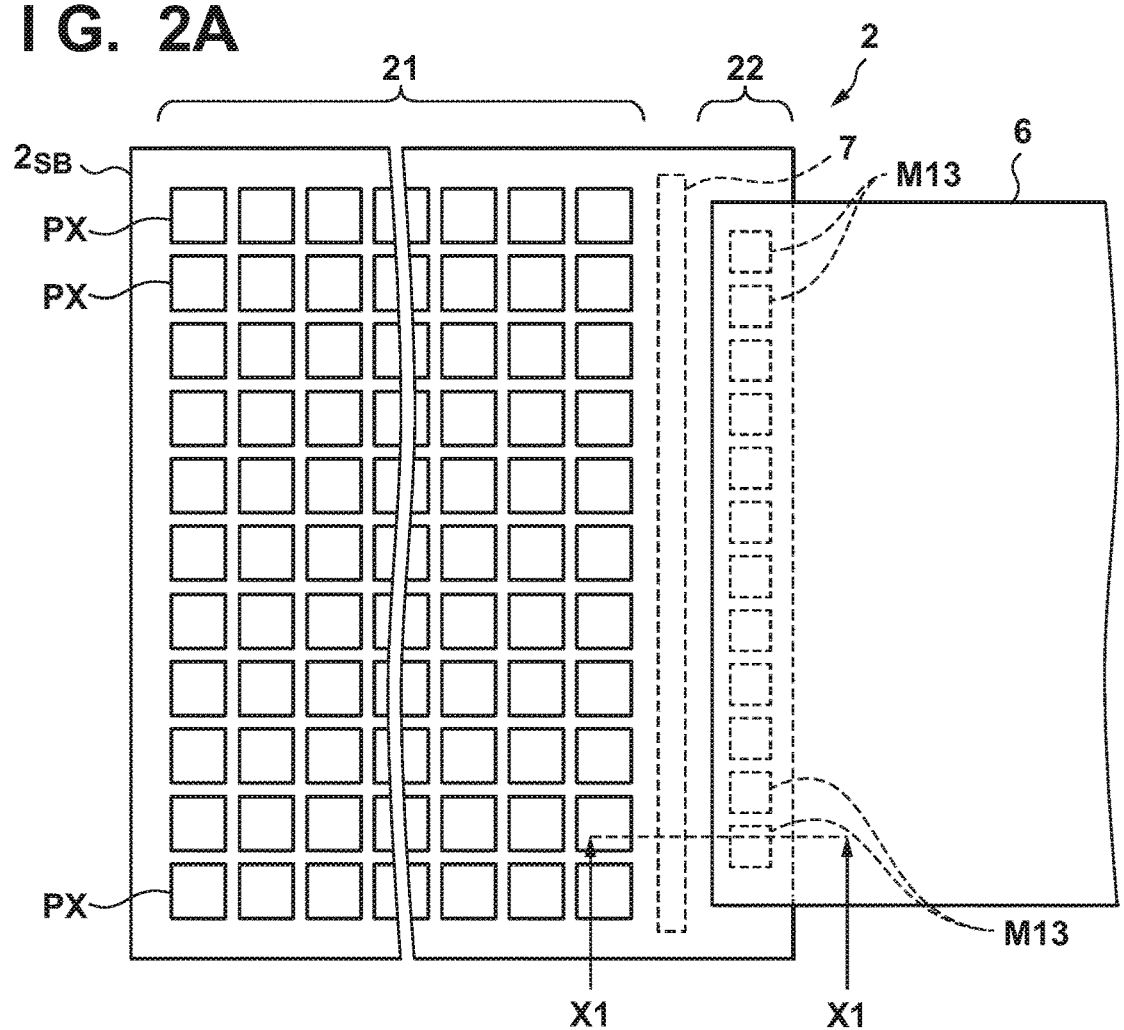
FIG. 2A is a schematic view for explaining an example of the structure of the display apparatus.
Figure 2B:
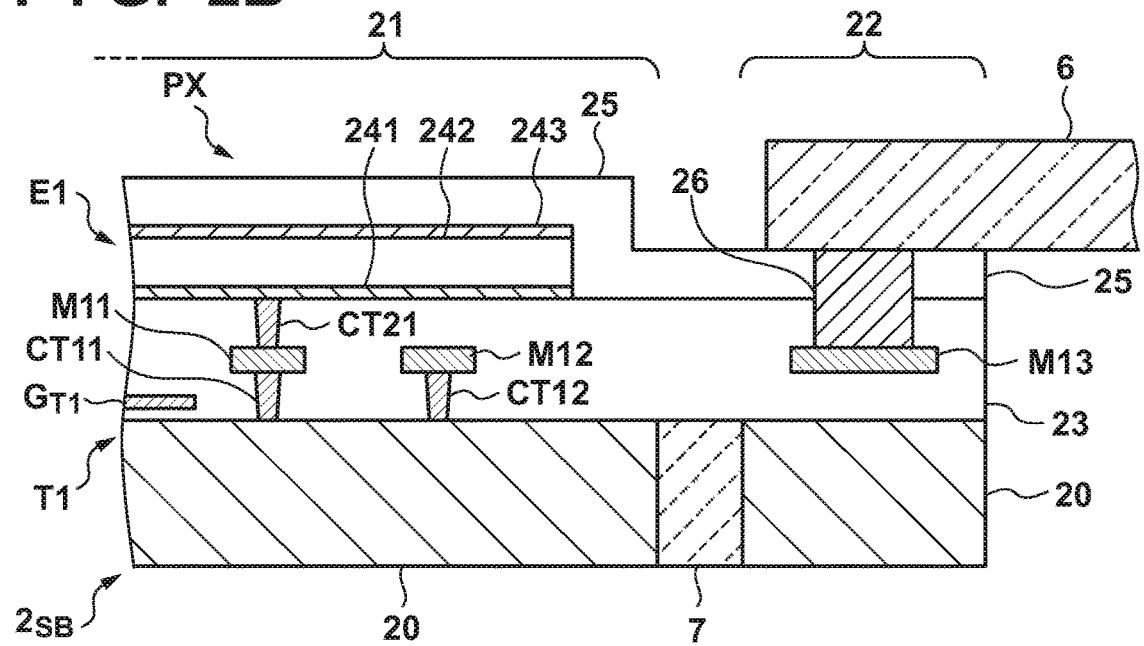
FIG. 2B is a schematic view for explaining an example of the structure of the display apparatus.

FIGS. 2A and 2B are schematic views showing an example of the structure of the display apparatus according to this embodiment. FIG. 2A is a top view of part of the structure of the display apparatus 1, mainly showing a peripheral region of the pixel portion 2. The pixel portion 2 may be configured to include an element substrate $2_{SB}$ including a display portion 21 and a connecting portion 22. The display portion 21 is located at a central portion of the element substrate $2_{SB}$ in planar view (top view), and is formed by arraying the plurality of pixels PX described above. The connecting portion 22 is located at an edge portion of the element substrate $2_{SB}$ in planar view, and is formed by being provided with an external connection interface for controlling the driving of the display portion 21.

Although described in detail later, a plurality of electrode pads to which a driving substrate 6 is connected are arrayed on the connecting portion 22. In addition, in planar view, the display portion 21 is separated from the connecting portion 22, and a heat-insulating portion 7 is provided between them.

FIG. 2B is a sectional view of the display apparatus 1 taken along line X1-X1 in FIG. 2A. The element substrate $2_{SB}$ further includes a base 20, and the display portion 21 and the connecting portion 22 are provided on the base 20. A substrate or plate member formed from silicon is preferably used as the base 20 in this embodiment. Alternatively, a semiconductor material (for example, gallium arsenide) other than silicon may be used for the base 20.

The base 20 of the display portion 21 is provided with the well region, drain region, and source region of the transistor T1 (none of which are shown) in correspondence with the plurality of pixels PX. A gate electrode $G_{T1}$ of the transistor T1 is provided between the drain region and the source region via an insulating film in top and planar views of the base 20.

The organic light emitting element E1 is provided above the transistor T1 via an insulating member 23. The organic light emitting element E1 includes a lower electrode 241, an organic compound layer 242, and an upper electrode 243. The lower electrode 241 corresponds to the anode of the organic light emitting element E1 according to this embodiment, and is connected to the source region of the transistor T1 via a wiring layer M11 and contact plugs CT11 and CT21 inside the insulating member 23. Note that the wiring layer M11 and the contact plugs CT11 and CT21 may be additionally provided with barrier metals (these members may be collectively expressed by wiring portions or the like). According to this embodiment, the upper electrode 243 corresponds to the cathode of the organic light emitting element E1 and is grounded.

In this embodiment, the organic compound layer 242 is formed by sequentially stacking a hole transport layer, a light emitting layer, and an electron transport layer from the lower side in that order. The organic compound layer 242 emits light when a predetermined voltage is applied between the lower electrode 241 and the upper electrode 243. More specifically, upon application of the above voltage, electrons in the constituent molecules of the organic compound layer 242 are set in an excited state. The emitted energy generated when the electrons return to the ground state causes the electrons to emit light having a predetermined wavelength. In another embodiment, the organic compound layer 242 may further include a hole injection layer at a boundary portion with the lower electrode 241 and/or an electron injection layer at a boundary portion with the upper electrode 243. Note that as a material for the light emitting layer, a material that can emit light in a desired color is preferably selected. However, in another embodiment, a color filter may be provided on an emission surface for emitted light.

In each pixel PX of the display portion 21, a predetermined power supply voltage (a ground voltage in this case) is supplied to the well region of the transistor T1 on the base 20 via a wiring layer M12 and a contact plug CT12 in the insulating member 23.

Assume that in this embodiment, when the organic compound layer 242 emits light, the emitted light is output upward in FIG. 2B. Accordingly, a conductive material having light reflectivity, such as aluminum or silver, is used for the lower electrode 241, and a conductive material having light transmissivity, such as ITO (Indium Tin Oxide), IZO (Indium Zinc Oxide), or IGZO (Indium Gallium Zinc Oxide), is used for the upper electrode 243. Note that a thin metal film (MgAg or the like) that can sufficiently transmit the above emitted light may be used as another example of the upper electrode 243.

The arrangement of the display portion 21 or the pixel PX is not limited to that according to this embodiment. For example, the vertical orientation of the organic light emitting element E1 may be inverted such that the anode side becomes the light emission side. In this case, a conductive material having light transmissivity may be used for an electrode on the anode side.

A protective film 25 is provided on the insulating member 23 so as to cover the organic light emitting element E1. Examples of the material used for the protective film 25 include materials having both light transmissivity and a moisture-proof property, such as silicon nitride and silicon oxynitride. Using such a material makes it possible to protect the organic light emitting element E1 against moisture as well as allowing the organic light emitting element E1 to emit light upward. Note that the insulating member 23 and the protective film 25 extend from the display portion 21 to the connecting portion 22.

The connecting portion 22 includes electrode pads M13 in the insulating member 23. In this embodiment, the plurality of electrode pads M13 are provided above the base 20 as a conductive layer flush with the wiring layers M11 and M12. Each electrode pad M13 is electrically connected to the driving substrate 6 via a conductive member 26. Note that this can be expressed as mounting the driving substrate 6 on the element substrate $2_{SB}$, and that the connecting portion 22 can be expressed as a mounting portion, substrate mounting portion, or the like.

The driving substrate 6 is a wiring board that implements the scanning signal driver 3, the information signal driver 4, and/or the voltage supply unit 5 (see FIG. 1A) connected to the pixel portion 2 or connection of one of them/them. Accordingly, the driving substrate 6 may be a substrate having flexibility or bendability so as to be deformable, such as a flexible wiring board, or COF (Chip On Film) or a substrate substantially having no flexibility or bendability, such as a rigid wiring board or lead frame.

For example, the scanning signal SIG3 input from the electrode pad M13 to the driving substrate 6 is supplied to the corresponding transistor T1 via a wiring pattern (not shown). In addition, the information signal SIG4 input from the driving substrate 6 to another electrode pad M13 is supplied to the corresponding transistor T1 via a wiring pattern (not shown). Alternatively, the scanning signal SIG3 and the information signal SIG4 encoded in a predetermined form may be input to the electrode pad M13, decoded by a decoder (not shown) on the pixel portion 2, and supplied to the transistor T1. In addition, still another electrode pad M13 is connected to the wiring layer M12 via a wiring pattern (not shown), and the ground voltage input from the driving substrate 6 to the electrode pad M13 is supplied to the well region of the transistor T1. In this manner, the driving substrate 6 is connected to the connecting portion 22 so as to make it possible to drive the display portion 21.

FIGS. 3A to 3H show a structure or aspect in each step of a method of manufacturing the display apparatus 1. In brief, this manufacturing method is configured to form the heat-insulating portion 7 on the base 20 after the formation of the transistor T1 and the organic light emitting element E1 on the base 20 and then mount the driving substrate 6. The respective steps of the manufacturing method can be implemented by, for example, a deposition method such as PVD (Physical Vapor Deposition) or CVD (Chemical Vapor Deposition), a coating method such as spin coating, etching using a photolithography technique, and other known semiconductor manufacturing process.

Figure 3A:
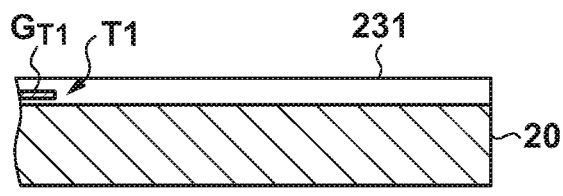
FIG. 3A is a schematic view for explaining an example of a method of manufacturing a display apparatus.

In the step shown in FIG. 3A, in this embodiment, after a silicon substrate is prepared as the base 20, the transistor T1 and an insulating member 231 covering the transistor T1 are formed the base 20. For example, a silicon oxide or silicon oxynitride is used for the insulating member 231. Although not shown, the upper surface of the base 20 is partitioned for each pixel PX by element isolation portions such as portions for STI (Shallow Trench Isolation).

Figure 3B:
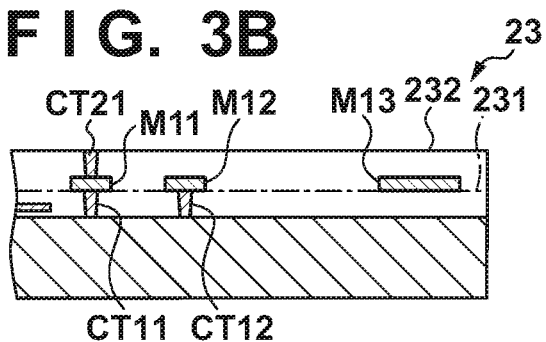
FIG. 3B is a schematic view for explaining an example of the method of manufacturing the display apparatus.

In the step shown in FIG. 3B, the contact plugs CT11 and CT12 are formed in the insulating member 231 having the structure obtained in the step shown in FIG. 3A, and the wiring layers M11 and M12 and the electrode pad M13 are formed on the insulating member 231. Thereafter, an insulating member 232 is formed on the insulating member 231, and the contact plug CT21 is further formed in the insulating member 232. For example, copper, aluminum, or the like is used for the wiring layers M11 and M12 and the electrode pad M13. For example, tungsten or the like is used for the contact plugs CT11, CT12, and CT21. For example, a silicon oxide or silicon oxynitride is used for the insulating member 232 like the insulating member 231. Note that the insulating members 231 and 232 are collectively referred to as the insulating members 23 described with reference to FIG. 2B.

Figure 3C:
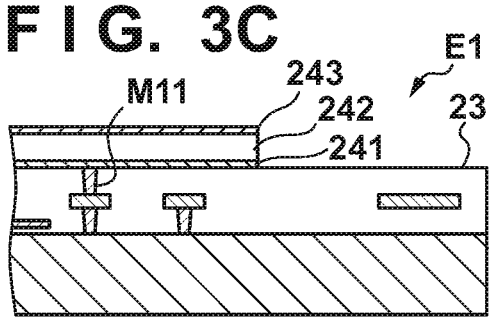
FIG. 3C is a schematic view for explaining an example of the method of manufacturing the display apparatus.

In the step shown in FIG. 3C, the organic light emitting element E1 is formed on the contact plug CT21 having the structure obtained in the step shown in FIG. 3B. As described above, the organic light emitting element E1 includes the lower electrode 241, the organic compound layer 242, and the upper electrode 243. Note that they are formed from below in that order.

Figure 3D:
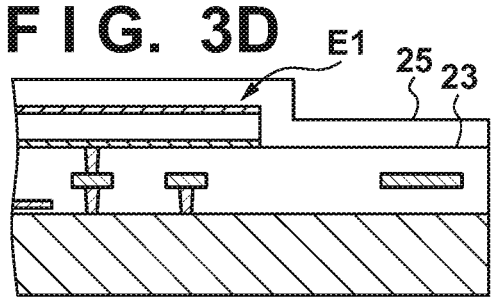
FIG. 3D is a schematic view for explaining an example of the method of manufacturing the display apparatus.

In the step shown in FIG. 3D, the protective film 25 is formed on the structure obtained in the step shown in FIG. 3C, that is, the insulating member 23, so as to cover the organic light emitting element E1. For example, a material having light transmissivity and a moisture-proof property such as a silicon oxide or silicon oxynitride is used for the protective film 25.

Figure 3E:
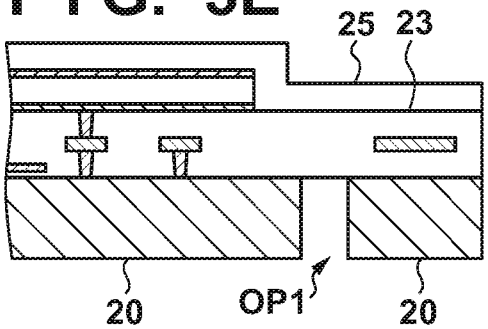
FIG. 3E is a schematic view for explaining an example of the method of manufacturing the display apparatus.

In the step shown in FIG. 3E, an opening OP1 is formed on the lower surface side of the base 20 having the structure obtained in the step shown in FIG. 3C. In this embodiment, the opening OP1 is formed to expose the lower surface of the insulating member 23. The opening OP1 is provided to penetrate the base 20, and hence may be expressed as a through hole. In this embodiment, the opening OP1 having a width of 100 μm was formed in the base 20 having a thickness of about 725 μm. The opening OP1 can be formed by deep RIE (plasma etching using a so-called Bosch process), and can also be implemented by isotropic etching such as wet etching.

In order to facilitate the formation of the opening OP1, the base 20 may be thinned by back grinding with respect to the lower surface of the base 20 after the step shown in FIG. 3D and before the step shown in FIG. 3E.

Although not shown, the inner wall of the opening OP1 is preferably provided with a protective film having a moisture-proof property. That is, this protective film is provided at the boundary portion between the heat-insulating portion 7 formed afterward and the base 20. This can prevent the display portion 21 that can be formed in the later step from being immersed with water. For example, the same material as that for the protective film 25, such as a silicon oxide or silicon oxynitride, can be used for this protective film. However, this film need not have light transmissivity, and hence, for example, an aluminum oxide or aluminum nitride may be used for the film.

Figure 3F:
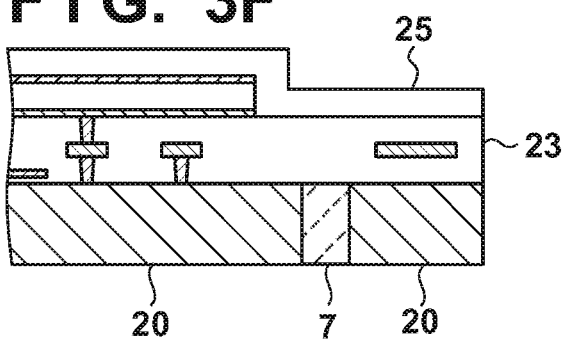
FIG. 3F is a schematic view for explaining an example of the method of manufacturing the display apparatus.

In the step shown in FIG. 3F, the heat-insulating portion 7 is formed by filling the opening OP1 having the structure obtained in the step shown in FIG. 3E with a material having relatively low heat conductivity. Although described in detail later, a material having low heat conductivity (that is, high heat conduction resistance) as compared with the base 20 (for example, having a heat conductivity of 168 W/(m·K) when made of silicon) is used for the heat-insulating portion 7. For example, an inorganic material such as a silicon oxide, silicon nitride, or aluminum oxide may be used for the heat-insulating portion 7. Alternatively, an organic material (resin material) such as epoxy resin, urethane resin, or polyester resin may be used for the heat-insulating portion 7. In these cases, because a resin material has lower heat conductivity than an inorganic material and can easily fill the opening OP1, a resin material, especially epoxy resin (heat conductivity: 0.2 W/(m·K), is preferably used.

Air has lower heat conductivity (0.024 W/(m·K)) than a resin material, and hence the heat-insulating portion 7 may include cavities such as an air bubble or air layer. The entire heat-insulating portion 7 may be a cavity. In this case, however, because the base 20 may decrease in strength, the opening OP1 is preferably partially filled with a resin material. For example, the opening OP1 may be filled with hollow beads together with a resin material.

Figure 3G:
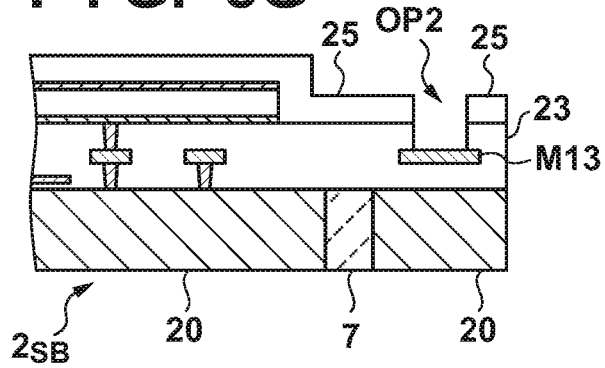
FIG. 3G is a schematic view for explaining an example of the method of manufacturing the display apparatus.

In the step shown in FIG. 3G, an opening OP2 is formed so as to expose an electrode pad 13 by removing part of the protective film 25 and the insulating member 23, which have the structure obtained in the step shown in FIG. 3F, by etching. Note that the structure obtained by this process corresponds to the element substrate $2_{SB}$ described with reference to FIGS. 2A and 2B.

Figure 3H:
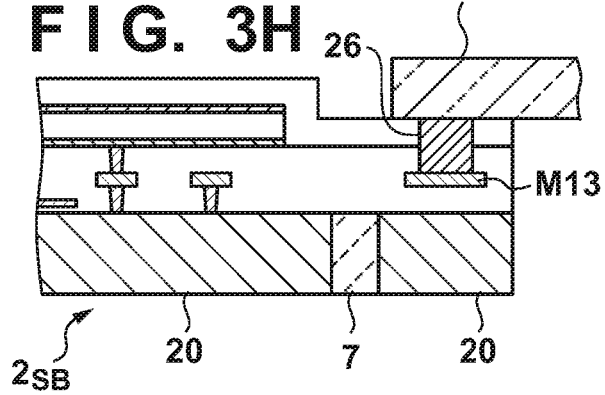
FIG. 3H is a schematic view for explaining an example of the method of manufacturing the display apparatus.

In the step shown in FIG. 3H, while the conductive member 26 is formed in the opening OP2 having the structure obtained in the step shown in FIG. 3G, the driving substrate 6 is mounted by using the conductive member 26. That is, the electrode pad 13 is electrically connected to the driving substrate 6 via the conductive member 26.

Assume that in this embodiment, the driving substrate 6 is mounted by thermal compression bonding using an ACF (Anisotropic Conductive Film). A portion of the anisotropic conductive film which has undergone thermal compression bonding becomes conductive, and the remaining portion is kept nonconductive. Assume that this thermal compression bonding is performed under the conditions in which a pressure bonding portion applies a pressure of 5 N/m² at a temperature of 170° C. for 15 sec.

Although the above heat is applied to the connecting portion 22 during the step shown in FIG. 3H, because the base 20 is provided with the heat-insulating portion 7, the heat-insulating portion 7 cuts off conduction of the above heat to the display portion 21.

In another embodiment, the driving substrate 6 may be mounted by bump connection using an electrical connection bump as the conductive member 26. Examples of such electrical connection bumps include a solder bump, gold bump, and silver bump. In this case as well, although predetermined heat is applied to the connecting portion 22, the heat-insulating portion 7 cuts off conduction of the heat to the display portion 21. In addition, in still another embodiment, when, for example, the driving substrate 6 is a lead frame, the driving substrate 6 may be mounted by wire bonding. In this case, a bonding wire to be melted corresponds to the conductive member 26, and the heat-insulating portion 7 cuts off conduction of the heat generated in this process to the display portion 21 as in the above case.

As is also obvious from FIG. 2A, the heat-insulating portion 7 extends between the display portion 21 and the connecting portion 22 along an edge portion of the element substrate $2_{SB}$ in planar view, that is, along an edge portion of the base 20 (see FIG. 2B). Accordingly, in the step shown in FIG. 3E, the opening OP1 is formed in a trench shape along an edge portion of the base 20 in planar view.

In this embodiment, the display portion 21 and the connecting portion 22 are provided side by side in a side direction or longitudinal direction of the base 20 in planar view, and the heat-insulating portion 7 is provided to overlap all the organic light emitting elements E1. This can also properly cut off conduction of heat applied to the connecting portion 22 to any of the organic light emitting elements E1. Likewise, in the above direction, the heat-insulating portion 7 is provided to overlap the entire driving substrate 6. This can properly cut off conduction of the above heat from the connecting portion 22 to the display portion 21.

As described above, the connecting portion 22 includes the plurality of electrode pads M13, which are arrayed along an edge portion of the base 20 in planar view. The heat-insulating portion 7 extends between the plurality of organic light emitting elements E1 and the plurality of electrode pads M13 along an edge portion of the base 20 so as not to overlap them in planar view. This structure makes it possible to properly cut off conduction of the above heat and suppress the influence of a stress that can be exerted on each element at the time of the manufacture of the display apparatus 1. That is, the structure is also advantageous in improving reliability.

The opening OP1 is formed into a trench shape along an edge portion of the base 20, and hence the strength of the element substrate $2_{SB}$ can decrease because of the opening OP1 in the trench shape. In order to maintain (or improve) the strength of the element substrate $2_{SB}$, a reinforcing material may be provided for the element substrate $2_{SB}$. This reinforcing material may be provided at least between the display portion 21 and the connecting portion 22 so as to stride the opening OP1 in planar view. As a result, this reinforcing material overlaps the heat-insulating portion 7 formed afterward in planar view. The reinforcing material may be provided on the element substrate $2_{SB}$ (on the protective film 25) or below the element substrate $2_{SB}$ (the lower surface of the base 20).

When the reinforcing material is provided on the element substrate $2_{SB}$, the providing step may be performed before the step shown in FIG. 3E. Because the upper surface of the protective film 25 has a stepped portion due to the thickness of the organic light emitting element E1, an adhesive (for example, an adhesive having light transmissivity such as an epoxy resin adhesive or urethane resin adhesive) for fixing the reinforcing material may be formed to fill the stepped portion. The reinforcing material can be removed after the step shown in FIG. 3F (that is, after the heat-insulating portion 7 is formed in the opening OP1). Otherwise, a plate material (for example, a glass substrate) that can transmit light emitted from the organic light emitting element E1 is preferably used as a reinforcing material. In the steps shown in FIGS. 3G and 3H, in order to form the opening OP2 and mount the driving substrate 6, the reinforcing material is preferably placed at least inward from a position at which the opening OP2 should be located or at a position at which the driving substrate 6 should be mounted in the element substrate $2_{SB}$ surface direction.

When the reinforcing material is to be provided below the element substrate $2_{SB}$, the providing step may be performed after the step shown in FIG. 3E. In this case, the heat-insulating portion 7 can also be formed by filling the opening OP1 with an adhesive for fixing the reinforcing material. In other words, the heat-insulating portion 7 has a fixing function of fixing the reinforcing material with an adhesive as well as the heat-insulating function described above. Note that in this embodiment, because the organic light emitting element E1 emits light upward, when a reinforcing material is to be placed under the element substrate $2_{SB}$, the reinforcing material may not have light transmissivity.

An aspect about heat conduction when the driving substrate 6 is mounted at a temperature of 120° C. will be described below by using a simple model for the sake of easy understanding. The following description uses the following parameters:

V: the volume of the connecting portion 22
H: the thickness (height) of the base 20
L: the length of the base 20 (the length in the array direction of the plurality of electrode pads M13)
W: the width of the connecting portion 22
c: the specific heat of silicon (0.713 kJ/(kg·° C.)
ρ: the density of silicon (2330 kg/m³)

First Example

Consider first, as a first case (reference case), a case in which in the arrangement without the heat-insulating portion 7, the driving substrate 6 is mounted at a temperature of 170° C. on the connecting portion 22 of the base 20 having an initial temperature of 20° C. When the dimensions of the base 20 are set as follows:
H=725 μm=0.725 mm
L=10 mm
W=3 mm
then the volume V of the 22 is $$V = H \times L \times W \approx 2.2 \times 10^{-8} m^3$$

When, for example, the temperature of the connecting portion 22 is raised from 20° C. to 170° C. in about 5 sec (1.4×10⁻³ hr), that is, a temperature change amount is set to ΔT=150 K(° C.), a heat quantity Q given below is applied to the connecting portion 22:

$$Q=0.278 \times c \times \rho \times V \times \Delta T/(1.4 \times 10^{-3}) \approx 1.08 \, W$$

The heat quantity Q described above is transferred in a direction in which the base 20 is separated from the connecting portion 22. In this case, letting
R: the heat thermal resistance of the base 20
A: the sectional area of the base 20
X: the distance from the connecting portion 22 of the base 20
κ: the thermal conductivity of silicon (168 W/(m·K))
then $$R=X/(\kappa \times A)[K/W]$$

A temperature difference ΔT(X) at a position separated from the connecting portion 22 by a distance X [m] is represented by $$\Delta T(X) = R \times Q = Q \times X / (\kappa \times A)$$

When
Q=1.08 W
κ=168 W/(m·k)
A=7.25×10⁻⁶ m²
then $$\Delta T(X)=887 \times X$$

In the first example in which the heat-insulating portion 7 is not provided in the base 20, a temperature T(X) at a position separated from the connecting portion 22 by the distance X [m] can be represented by $$T(X) = 170 - \Delta T(X) = 170 - 887 \times X$$

Second Example

Consider the second example (another reference example) as an example in which the driving substrate 6 is mounted in the arrangement provided with a heat-insulating portion (to be referred to as a heat-insulating portion 7' for discrimination from the heat-insulating portion 7) that does not penetrate the base 20 in the same procedure as in the first example. Assume that epoxy resin is used as a material for the heat-insulating portion 7', and the following calculation is performed assuming that the heat conductivity of the epoxy resin is 0.2 W/(m·K).

The heat-insulating portion 7' does not penetrate the base 20, and hence the base 20 is thinned immediately on the heat-insulating portion 7'. In this case, this portion (to be expressed as the "thinned portion" hereinafter) of the base 20 has a thickness of 40 μm. In this case, a sectional area of the thinned portion is given as $$A'=4 \times 10^{-7} \, m^2$$

Assume that the heat-insulating portion 7' that does not penetrate the base 20 is provided with a width equal to or larger than X. In this case, a temperature T'(X) at a position separated from the connecting portion 22 by the distance X [m] can be represented by $$T'(X)=170-16071 \times X$$

Third Example

Consider the third example as an aspect of this embodiment in which the driving substrate 6 is mounted in the arrangement provided with the heat-insulating portion 7 so as to penetrate the base 20, in the same procedure as in the first and second examples. Assume that epoxy resin is used for the heat-insulating portion 7 as in the second example. Assume that in the third example, the base 20 is ideally divided by the heat-insulating portion 7, and the substantially whole heat quantity Q is transferred in the heat-insulating portion 7 in a direction in which the connecting portion 22 is separated.

Assume that the heat-insulating portion 7 penetrating the base 20 is provided with a width equal to or larger than X. In this case, a temperature T"(X) at a position separated from the connecting portion 22 by the distance X [m] can be represented by $$T''(X)=170-744827 \times X$$

Figure 4:
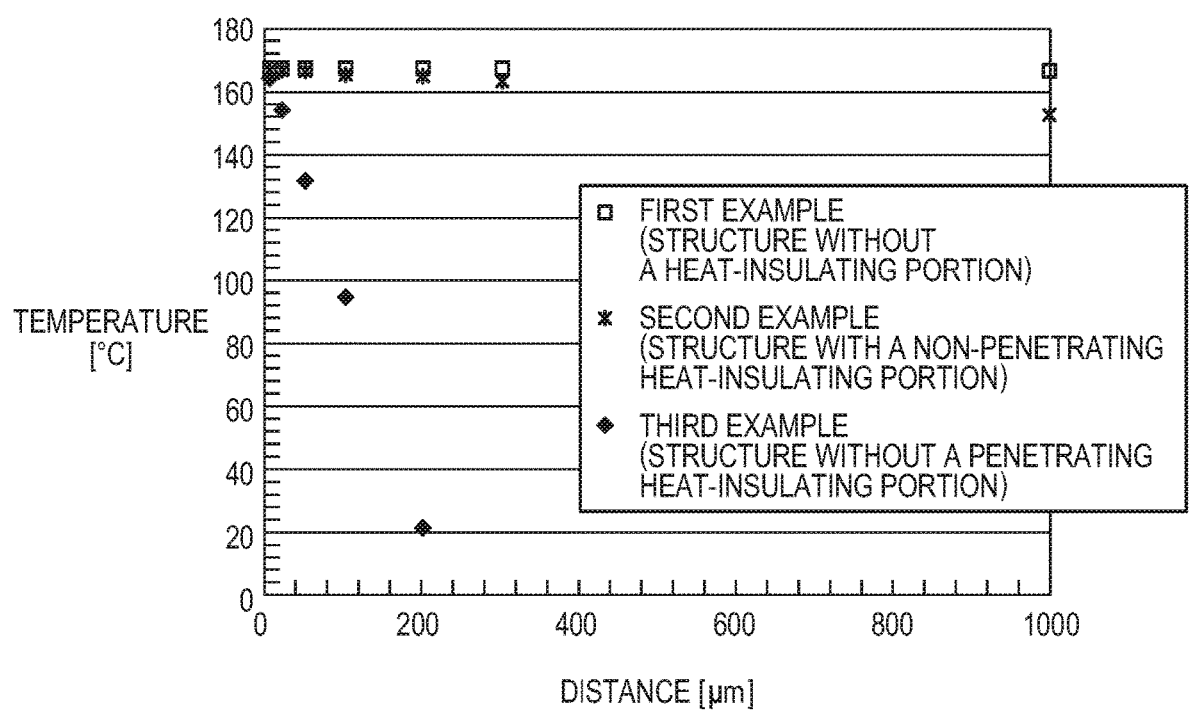
FIG. 4 is a view for explaining the influence of heat conduction in a base at the time of the manufacture of a display apparatus.

FIG. 4 shows the result obtained by plotting temperatures at positions separated from the connecting portion 22 by the distances X in each of the first to third examples. The abscissa represents distances (unit: μm) from the connecting portion 22, and the ordinate represents temperatures (unit: ° C.) at the respective positions.

As is obvious from FIG. 4, in the first example without the heat-insulating portion 7, the temperature at the position separated from the connecting portion 22 by 1 mm is 169° C., which is almost equal to the temperature of the driving substrate 6 at the time of mounting, which is 170° C. Accordingly, in the first example, the heat generated when the driving substrate 6 is mounted is conducted to the display portion 21, and the display portion 21 can deteriorate due to the influence of the heat. In the second example with the heat-insulating portion 7' provided so as not to penetrate the base 20, the temperature at a position separated from the connecting portion 22 by 1 mm is 154° C. This indicates that the conduction of the heat described above is suppressed as compared with the first example.

In the third example with the heat-insulating portion 7 provided so as to penetrate the base 20, the temperature at a position separated from the connecting portion 22 by 100 µm is about 96° C. This indicates that the conduction of the heat described above is further suppressed. In this embodiment, providing the heat-insulating portion 7 with a width of about 100 µm can sufficiently cut off the conduction of heat to the display portion 21. In addition, the comparisons among the first to third examples indicate that the third example can shorten the distance between the display portion 21 and the connecting portion 22 as compared with the first and second examples, and hence can reduce the size of the element substrate $2_{SB}$.

As described above, according to this embodiment, the heat-insulating portion 7 is provided between the display portion 21 and the connecting portion 22 on the base 20 in planar view. The heat-insulating portion 7 has a lower heat conductivity (a larger heat conduction resistance than the base 20) than the base 20. For this reason, in a manufacturing process for the display apparatus 1, the display portion 21 is robust against the influence of heat when the driving substrate 6 is connected to the connecting portion 22. According to the embodiment, it is possible to prevent the display portion 21 from deteriorating accompanying the heat and improve the quality of the display apparatus 1.

The heat-insulating portion 7 is preferably provided so as to penetrate the base 20 as described with reference to FIGS. 2B and 3E to 3H. Letting the heat-insulating portion 7 penetrate the base 20 will properly cut off the heat conduction path from the connecting portion 22 to the display portion 21 in the base 20. As described with reference to FIG. 4, this can make it difficult to conduct heat to the display portion 21 when the driving substrate 6 is connected to the connecting portion 22. That is, this arrangement is further advantageous in improving the quality of the display apparatus 1. In addition, shortening the distance between the display portion 21 and the connecting portion 22 can reduce the size of the element substrate $2_{SB}$.

As described with reference to FIG. 2A, the heat-insulating portion 7 preferably overlaps all the organic light emitting elements E1 in a predetermined direction, and more preferably overlaps the entire driving substrate 6. This makes it possible to prevent the heat generated when the driving substrate 6 is connected to the connecting portion 22 from conducting to any of the plurality of organic light emitting elements E1. That is, this arrangement is further advantageous in improving the quality of the display apparatus 1.

Although in this embodiment, the connecting portion 22 is provided on an edge portion (side portion) of the base 20 in planar view, the connecting portion 22 may also be provided on another edge portion (another side portion). That is, the connecting portion 22 can be partially or entirely provided on a peripheral edge portion of the base 20 in planar view.

Second Embodiment

Figure 5:
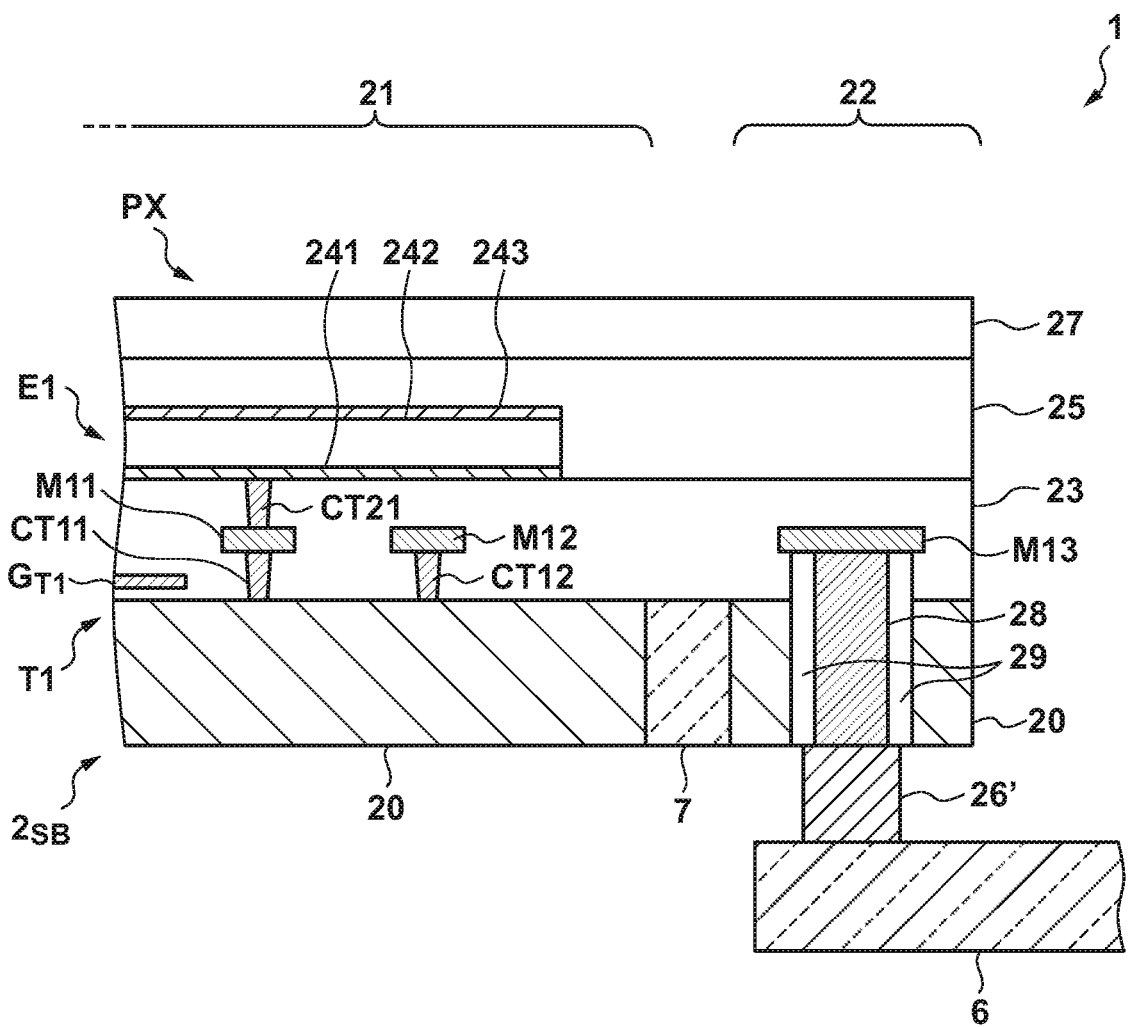
FIG. 5 is a schematic view for explaining an example of the structure of a display apparatus.

FIG. 5 is a sectional view of the structure of a display apparatus 1 according to the second embodiment as in the first embodiment (FIG. 2B). The second embodiment mainly differs from the first embodiment in that an element substrate $2_{SB}$ further includes a through electrode (TSV (Through-Silicon Via)) 28 serving as an external connecting electrode. That is, in this embodiment, a driving substrate 6 is electrically connected to an electrode pad M13 via the through electrode 28 below the element substrate $2_{SB}$. According to the embodiment, for example, it is possible to relatively simplify the upper structure of the display apparatus 1 and allow an organic light emitting element E1 to favorably emit light upward.

The through electrode 28 extends from the lower surface of a base 20 into an insulating member 23 and comes into contact with the lower surface of the electrode pad M13. A side surface of the through electrode 28 is covered by an insulating protective film 29. This electrically separates the through electrode 28 from the base 20. In this embodiment, the through electrode 28 is electrically connected to the driving substrate 6 via a conductive member 26'. Although an anisotropic conductive film can be used as the conductive member 26', various connection modes using an electrical connection bump, a bonding wire, and the like can be used as in the first embodiment.

FIGS. 6A to 6F show a structure or mode in each step in the method of manufacturing the display apparatus 1. An overview of this manufacturing method is that after a transistor T1 and the organic light emitting element E1 are formed on the base 20 in the same procedure as that in the first embodiment, a heat-insulating portion 7 and the through electrode 28 are formed on the lower surface side of the base 20, and the driving substrate 6 is mounted. Each step in this manufacturing method can be implemented by a known semiconductor manufacturing process.

Figure 6A:
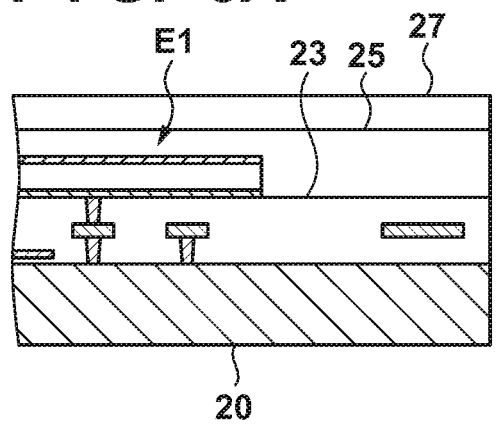
FIG. 6A is a schematic view for explaining an example of a method of manufacturing a display apparatus.

In the step shown in FIG. 6A, a support substrate 27 is arranged on the structure obtained in the step shown in FIG. 3C in the first embodiment via a protective film 25. Note that when the support substrate 27 is to be arranged, the upper surface of the protective film 25 is preferably planarized by, for example, CMP (Chemical Mechanical Polishing). The support substrate 27 serves as a support base for supporting a process target in the subsequent step of forming the through electrode 28 and also serves as an exit surface from which light emitted by the organic light emitting element E1 exits after the manufacture of the display apparatus 1. Accordingly, a substrate having light transmissivity such as a glass substrate is preferably used as the support substrate 27. For the same reason, the protective film 25 and the support substrate 27 are preferably fixed with an adhesive having light transmissivity such as an epoxy resin adhesive or urethane resin adhesive.

Figure 6D:
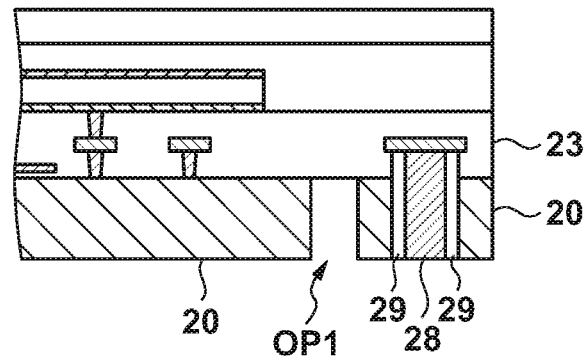
FIG. 6D is a schematic view for explaining an example of the method of manufacturing the display apparatus.
Figure 6B:
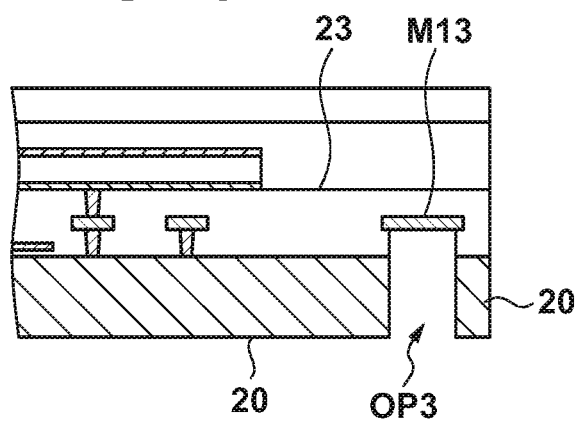
FIG. 6B is a schematic view for explaining an example of the method of manufacturing the display apparatus.

In the step shown in FIG. 6B, an opening OP3 is formed on the lower surface side of the base 20 having the structure obtained in the step shown in FIG. 6A. In this embodiment, the opening OP3 is formed such that the lower surface of the electrode pad M13 is exposed, that is, the base 20 is penetrated and part of the insulating member 23 is removed. The opening OP3 may be expressed as a through hole. The opening OP3 may be formed by deep RIE as in the step of forming the opening OP1 (the step shown in FIG. 3F) according to the first embodiment.

Figure 6E:
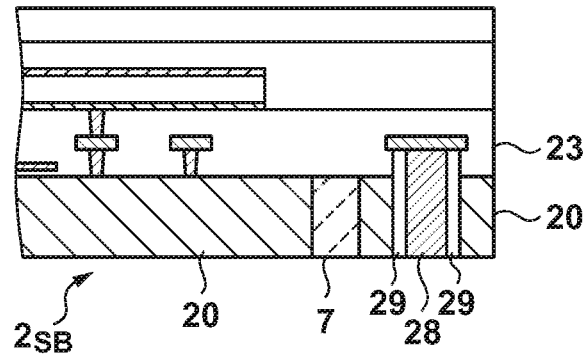
FIG. 6E is a schematic view for explaining an example of the method of manufacturing the display apparatus.
Figure 6C:
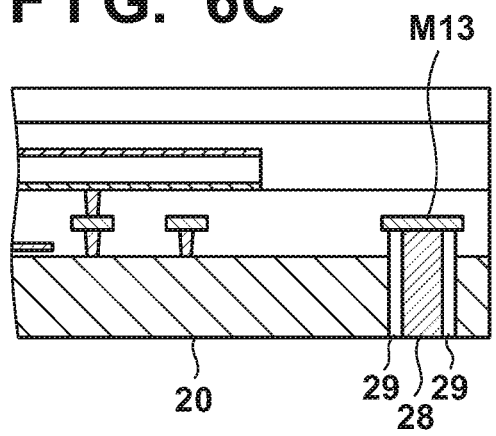
FIG. 6C is a schematic view for explaining an example of the method of manufacturing the display apparatus.

In the step shown in FIG. 6C, the through electrode 28 and the protective film 29 are formed in the opening OP3 having the structure obtained in the step shown in FIG. 6B. First of all, the inner wall of the opening OP3 is covered by the protective film 29. For example, an insulating material such as a silicon oxide or silicon nitride may be used for the protective film 29. This step can be implemented by forming an insulating film on the lower surface of the base 20 and in the opening OP3 by a deposition method such as plasma CVD and then etching back the insulating film so as to expose the lower surface of the electrode pad M13.

The through electrode 28 is then formed by filling the opening OP3 covered by the protective film 29 with a metal material. Because the inside of the opening OP3 is covered by the insulating protective film 29, the formed through electrode 28 is electrically separated from the base 20.

In the step shown in FIG. 6D, the opening OP1 is formed in the lower surface of the base 20 having the structure obtained in the step shown in FIG. 6C. This step can be executed in the same procedure as in the step shown in FIG. 3E according to the first embodiment.

In the step shown in FIG. 6E, the heat-insulating portion 7 is formed by filling the opening OP1 having the structure obtained in the step shown in FIG. 6D with a material having relatively low heat conductivity. This step can be executed in the same procedure as in the step shown in FIG. 3F according to the first embodiment. The structure obtained by this procedure corresponds to the element substrate $2_{SB}$ described with reference to FIG. 5.

Figure 6F:
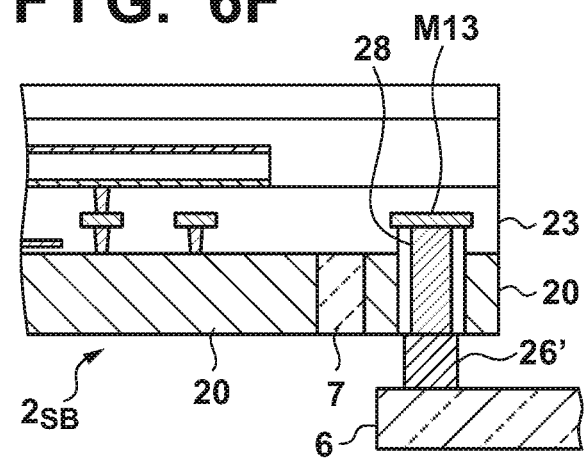
FIG. 6F is a schematic view for explaining an example of the method of manufacturing the display apparatus.

In the step shown in FIG. 6F, the driving substrate 6 is mounted on the through electrode 28 having the structure obtained in the step shown in FIG. 6E by using the conductive member 26'. That is, an electrode pad 13 is electrically connected to the driving substrate 6 via the conductive member 26'. This step can be executed in the same procedure as in the step shown in FIG. 3H according to the first embodiment.

As in the first embodiment, although the above heat is applied to the connecting portion 22 during the step shown in FIG. 6F, the heat-insulating portion 7 provided in the base 20 cuts off the conduction of the above heat to the display portion 21. This embodiment performs thermal compression bonding by using an anisotropic conductive film as the conductive member 26'. The above operation equally applies to a case in which the driving substrate 6 is mounted by using an electrical connection bump or a case in which the driving substrate 6 is mounted by using wire bonding. As described above, the embodiment can also properly cut off the conduction of heat from a connecting portion 22 to a display portion 21 when the driving substrate 6 is mounted, thereby preventing the display portion 21 from deteriorating accompanying the conduction of the heat. This can improve the quality of the display apparatus 1.

The sequence of the above steps can be changed as needed. For example, the steps shown in FIGS. 6B and 6C may be performed after the steps shown FIGS. 6D and 6E. In this embodiment, both the openings OP1 and OP3 can be provided on the lower surface side of the base 20, and hence can be formed by a common etching process. For example, part of the etching process performed in the step shown in FIG. 6B can be performed simultaneously with etching performed in the step shown in FIG. 6D. In addition, a step of placing a reinforcing material for the maintenance of the strength of the element substrate $2_{SB}$ may be inserted in the middle of the step described above as in the first embodiment.

[Others]

Although several preferred aspects have been exemplified above, the present invention is not limited to these examples. These aspects may be partly changed or combined together without departing from the spirit and scope of the present invention. Obviously, each term in this specification is merely used to explain the present invention, and the present invention is not limited to the strict meanings of the terms and can include their equivalents.

Assume, for example, that the concept of the display apparatus 1 includes not only an electronic device including a display function as a main function but also an electronic device including a display function as an auxiliary function. In addition, the base 20 may be expressed as a substrate, plate material, or the like. The wiring layer M11 and the like may be expressed as conductive layers, metal layers, or the like. Likewise, the wiring patterns for implementing the electrical connection of the wiring layers M11 and M12 and the electrode pad M13 may be expressed as conductive patterns, metal patterns, line patterns, or the like.

The present invention can provide a display apparatus that suppresses the conduction of heat at the time of manufacture to an organic light emitting element.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-075618, filed on Apr. 10, 2018, which is hereby incorporated by reference herein in its entirety.

What is claimed is:

1. A display apparatus comprising:
an element substrate including a display portion formed by arraying a plurality of organic light emitting elements on a base and a connecting portion provided on the base so as to be separated from the display portion;
a driving substrate connected to the connecting portion so as to be configured to drive the display portion; and
a heat-insulating portion provided between the display portion and the connecting portion in planar view in the base and configured to have lower heat conductivity than the base.

2. The apparatus according to claim 1, wherein the driving substrate is connected to the connecting portion via an anisotropic conductive film.

3. The apparatus according to claim 1, wherein the driving substrate is connected to the connecting portion via an electrical connection bump.

4. The apparatus according to claim 1, wherein the element substrate includes a through electrode provided as the connecting portion so as to penetrate the base.

5. The apparatus according to claim 1, wherein the heat-insulating portion is provided so as to penetrate the base.

6. The apparatus according to claim 1, wherein the element substrate further comprises a wiring layer that connects the base to the display portion, and
the connecting portion includes an electrode pad flush with the wiring layer.

7. The apparatus according to claim 1, wherein the connecting portion includes a plurality of electrode pads arrayed along an edge portion of the base, and
the heat-insulating portion extends between the plurality of organic light emitting elements and the plurality of electrode pads along the edge portion so as not to overlap any of the plurality of organic light emitting elements and the plurality of electrode pads in planar view.

8. The apparatus according to claim 1, wherein the base is formed from a semiconductor material.

9. The apparatus according to claim 1, wherein the heat-insulating portion is formed from one of an organic material and an inorganic material.

10. The apparatus according to claim 1, wherein the heat-insulating portion includes at least a cavity.

11. The apparatus according to claim 1, wherein the element substrate further includes a reinforcing material provided so as to overlap the heat-insulating portion in planar view.

12. The apparatus according to claim 1, further comprising a moisture-proof protective film provided at a boundary portion between the heat-insulating portion and the base.

13. The apparatus according to claim 1, wherein the element substrate further comprises a moisture-proof protective film that covers the display portion.

14. The apparatus according to claim 1, wherein the display portion and the connecting portion are arranged side by side in a first direction in planar view, and
the heat-insulating portion is provided so as to overlap all of the plurality of organic light emitting elements in the first direction.

15. The apparatus according to claim 14, wherein the heat-insulating portion is provided so as to overlap the entire driving substrate in the first direction.

16. A method of manufacturing a display apparatus including an element substrate including a display portion formed by arraying a plurality of organic light emitting elements and a connecting portion provided so as to be separated from the display portion and a driving substrate connected to the connecting portion so as to be configured to drive the display portion, the method comprising:
forming the display portion and the connecting portion on a base;
forming a heat-insulating portion for cutting off heat conduction between the display portion and the connecting portion by removing part of the base located between the display portion and the connecting portion in planar view; and
connecting the driving substrate to the connecting portion.

17. The method according to claim 16, wherein the forming the connecting portion includes forming an opening so as to penetrate the base and forming a through electrode as the connecting portion by filling the opening with a metal material, and
the forming the opening and the removing the part of the base are performed by a common etching process.

* * * * *